United States Patent [19]

Wieck et al.

[11] Patent Number: 5,338,692

[45] Date of Patent: Aug. 16, 1994

[54] METHOD OF GENERATING ACTIVE SEMICONDUCTOR STRUCTURES BY MEANS OF STARTING STRUCTURES WHICH HAVE A 2D CHARGE CARRIER LAYER PARALLEL TO THE SURFACE

[75] Inventors: Andreas D. Wieck, Sindelfingen; Klaus Ploog, Stuttgart, both of Fed. Rep. of Germany

[73] Assignee: Max-Planck-Gesellschaft Zur Forderung der Wissenschaften E.V., Gottingen, Fed. Rep. of Germany

[21] Appl. No.: 93,971

[22] Filed: May 3, 1993

Related U.S. Application Data

[63] Continuation of Ser. No. 513,995, Apr. 26, 1990, abandoned.

[30] Foreign Application Priority Data

Apr. 27, 1989 [DE] Fed. Rep. of Germany ....... 3914007
Dec. 20, 1989 [DE] Fed. Rep. of Germany ....... 3942125
Dec. 22, 1989 [DE] Fed. Rep. of Germany ....... 3942693

[51] Int. Cl.$^5$ .......................................... H01L 21/265
[52] U.S. Cl. ...................................... 437/24; 437/61; 437/133
[58] Field of Search ............... 148/DIG. 56, DIG. 65, 148/DIG. 72, DIG. 76, DIG. 86, 33, 33.1, 33.9; 437/18, 24, 26, 22, 41, 51, 59, 63, 61, 81, 107, 126, 108, 111, 133, 176, 912, 935, 936

[56] References Cited

U.S. PATENT DOCUMENTS

| | | | |
|---|---|---|---|
| 3,655,457 | 4/1972 | Duffy et al. | 437/25 |
| 3,696,274 | 10/1972 | Davis | 357/49 |
| 4,325,073 | 4/1982 | Hughes . | |
| 4,325,181 | 4/1982 | Yoder . | |
| 4,460,910 | 7/1984 | Chappell . | |
| 4,771,013 | 9/1988 | Curan | 437/31 |
| 4,796,068 | 1/1989 | Katayama et al. | 357/16 |
| 4,853,341 | 8/1989 | Nishioka et al. | 437/24 |
| 4,989,052 | 1/1991 | Okada et al. | 357/16 |
| 5,141,879 | 8/1992 | Goronkin . | |

FOREIGN PATENT DOCUMENTS

| | | |
|---|---|---|
| 0170023 | 6/1985 | European Pat. Off. . |
| 308166 | 3/1989 | European Pat. Off. . |
| 0394757 | 4/1990 | European Pat. Off. . |
| 2556038 | 6/1976 | Fed. Rep. of Germany . |
| 3221304A1 | 12/1983 | Fed. Rep. of Germany . |
| 3545434A1 | 3/1986 | Fed. Rep. of Germany . |
| 3724012A1 | 2/1989 | Fed. Rep. of Germany . |
| 2-78232 | 3/1990 | Japan . |

OTHER PUBLICATIONS

Wieck et al., "In-Plane-Gated Quantum Wire Transistor Fabricated with Directly Written Focused Ion Beams", Appl. Phys. Lett., 56(10), Mar. 5, 1990, pp. 928–930.

(List continued on next page.)

*Primary Examiner*—Robert Kunemund
*Assistant Examiner*—Ourmazd S. Ojan
*Attorney, Agent, or Firm*—Townsend and Townsend Khourie and Crew

[57] ABSTRACT

A unipolar electronic component is proposed with a quasi one dimensional carrier channel which has all the characteristics of an FET. This component can be very simply produced, has "self-alignment" and linear gates with a low capacity in place of planar gates. In this way a very high operating frequency of the component is possible. The structure comprises an initially homogenous 2D-layer with a high carrier mobility which is formed by epitaxy of for example GaAs. The implantation of focussed ions (for example Ga+ with 100 keV) locally destroys the conductivity of the electron layer. The irradiated regions remain insulating at low temperature or room temperature even after illuminating the cristal with bandgap radiation. The writing in of the insulating layer is carried out along two paths on the chip so that the 2D-carrier layer is subdivided into three regions insulated from one another. The source and drain are only connected by a narrow channel 44 the width of which is continuously tunable by a gate potential which is simultaneously applied to the two gate regions relative to the source, so that a pronounced change of the carrier concentration and thus of the channel resistance arises. The specification also describes integrated circuits made using the same methods.

35 Claims, 17 Drawing Sheets

OTHER PUBLICATIONS

Hirayama et al., ". . . Ballistic One-Dimensional Channels Controlled by a Gate Electrode", Appl. Phys. Lett. 54(25), Jun. 19, 1989, pp. 2556–2558.

Hirayama et al., ". . . Narrow Channels Constricted in GaAs by Highly Resistive Ga-Implanted Regions", Phys. Review B, 39(8) Mar. 15, 1989, pp. 5535–5537.

Nakamura et al., ". . . One-Dimensional Channels Made by Focused Ion Beams," Appl. Phys. Lett., 56(4), Jan. 22, 1990, pp. 385–387.

Susumu Namba, Focused Ion Bean Processing, (1989) 504–510 Nuclear Instruments and Methods in Physics Research B39.

IBM Technical Disclosure Bulletin, vol. 29, No. 5, Oct. 1986 Semiconductor Two-dimensional Hold Gas Heterostructures.

D. D'Avanzo, Proton Isolation for GaAs Integrated Circuits, vol. ED-29, No. 7, Jul. 1982, IEE Transactions on Electron Devices.

Demel, T., et al., "One-dimensional Electronic Systems in Ultrafine Mesa-etched Single and Multiple Quantum Well Wires," Appl. Phys. Lett. 53 (22), Nov. 28, 1988, pp. 2176–2178.

Moreland, J., et al., "Air as an Adjustable Insulator for C-V and G-V Analysis of Semiconductor Surfaces," Appl. Phys. Lett. 45 (1), Jul. 1, 1984, pp. 104–105.

Skocpol, W. J., et al., "Quantum Transport in Narrow Mosfet Channels," Surface Science 170 (1986) pp. 1–13.

Deng, X., "Oxygen Ion Beam Modification of GaAs," 2107 Nuclear Instruments & Methods in Physics Research, vols. 209/210, May 1983, pp. 657–661.

Hiramoto, T., "Fabrication of One-Dimensional GaAs Wires by Focused Ion Beam Implantation," J. Vac. Sci. Technol. B 6 (3), May/Jun. 1988, pp. 1014–1017.

Miyauchi, E., "Application of Focused Ion Beam Technology to Maskless Ion Implantation in a Molecular Beam Epitaxy Grown GaAs or AlGaAs Epitaxial Layer for Three-Dimensional Pattern Doping Crystal Growth," J. Vac. Sci. Technol. A 4 (3), May/Jun. 1986, pp. 933–938.

Grambow, P., et al., "Preparation of One-Dimensional Single and Multi-Layered Quantum Wire Structures by Ultrafine Deep Mesa Etching Techniques," Microelectronic Engineering 9 (1989) pp. 357–360.

Eden, R. C., et al., "Integrated Circuits: The Case for Gallium Arsenide," IEEE Spectrum, Dec. 1983, pp. 30–37.

Fig. 11
(a)
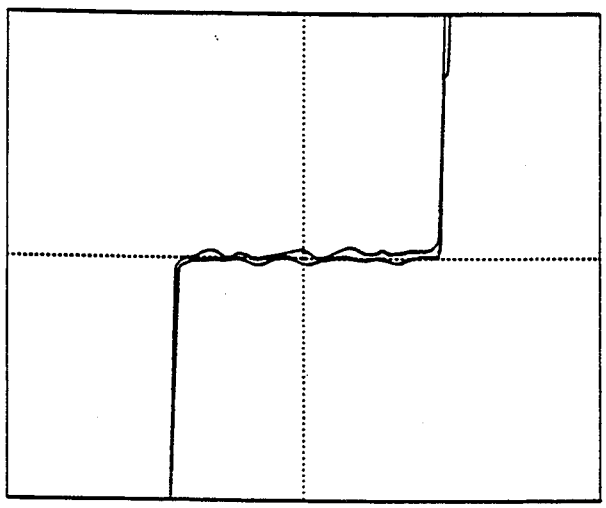
(b)
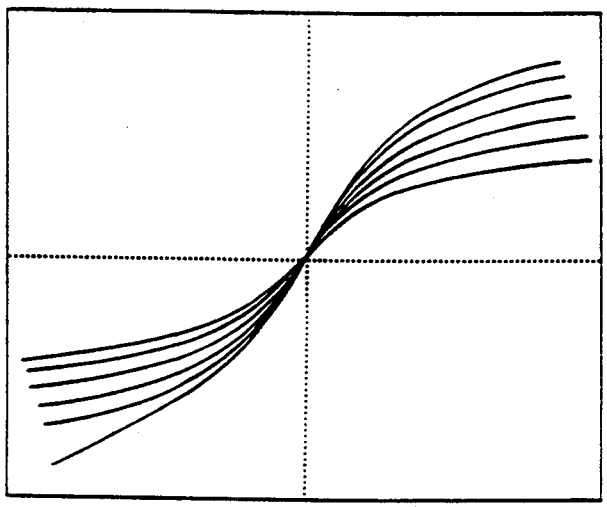
(c)
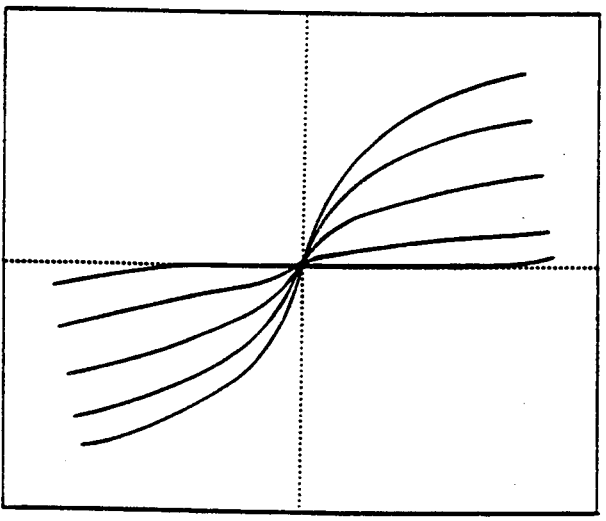

Fig. 12
(a)
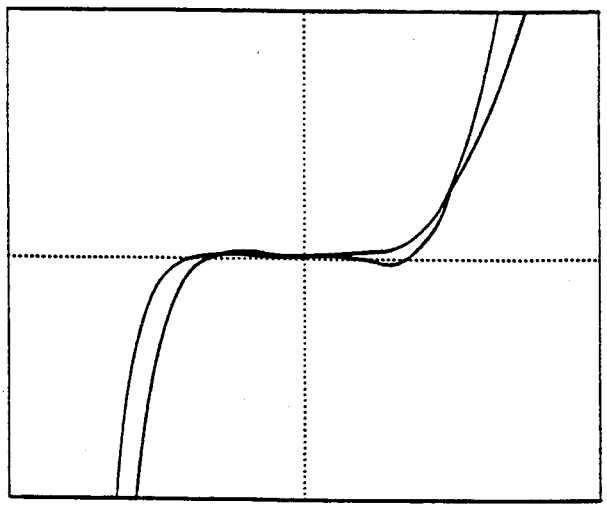
(b)
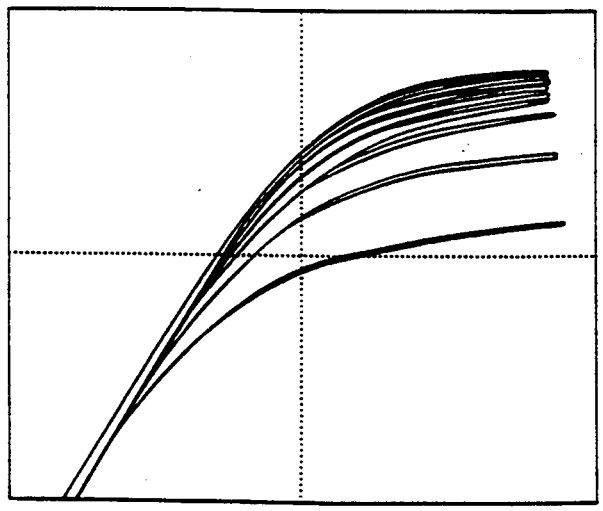
(c)
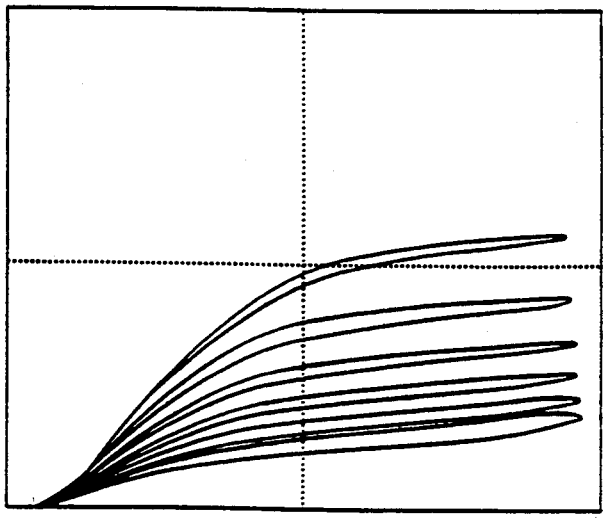

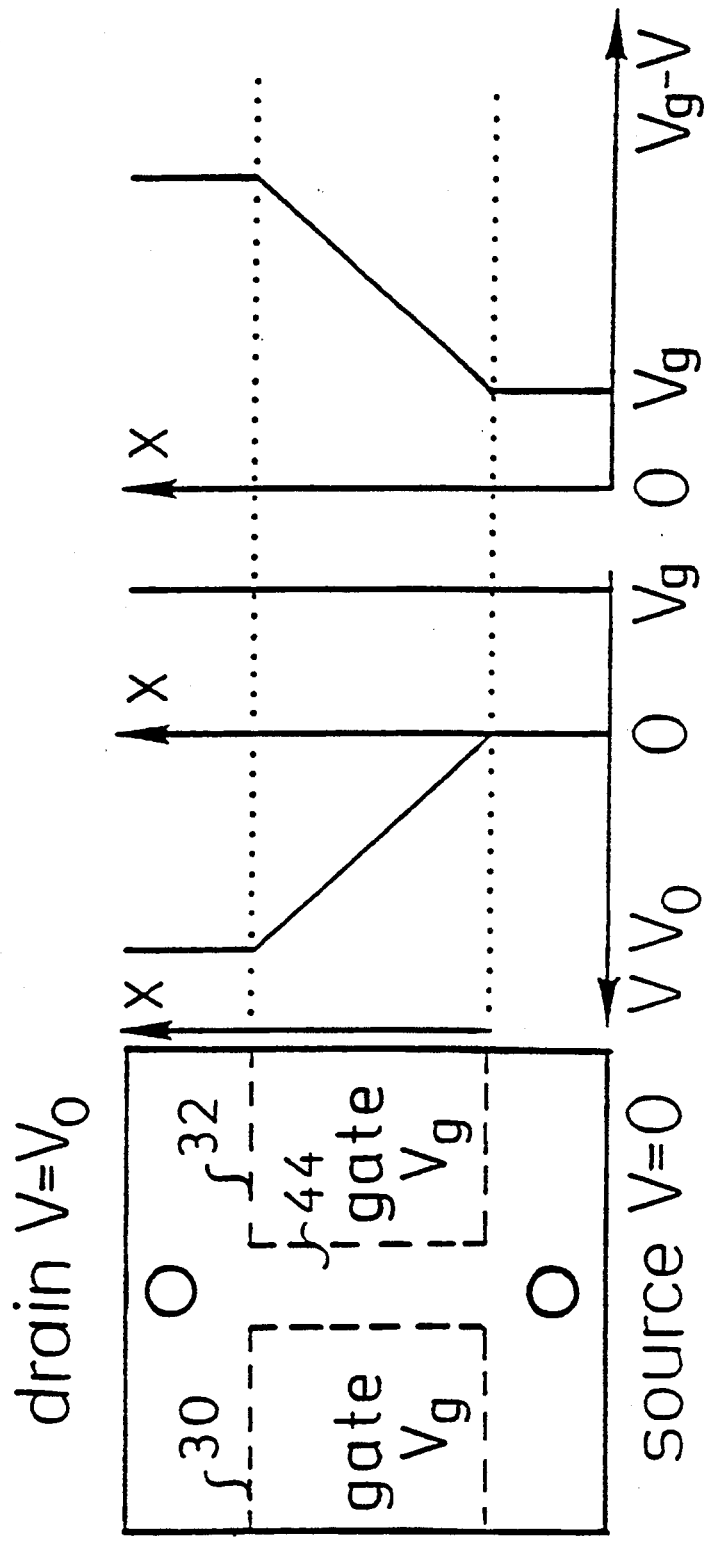

AND-GATE

METHOD OF GENERATING ACTIVE SEMICONDUCTOR STRUCTURES BY MEANS OF STARTING STRUCTURES WHICH HAVE A 2D CHARGE CARRIER LAYER PARALLEL TO THE SURFACE

This is a continuation of U.S. Ser. No. 07/513,995, filed Apr. 26, 1990, now abandoned.

The present invention relates to a method of generating active semiconductor structures by means of starting structures which have a 2D-charge carrier layer parallel to the surface, and also to field effect transistors which are manufactured in accordance with this method. The method also serves for the manufacture of integrated and highly integrated circuits.

A method or a field effect transistor of this kind has been described in the article "split gate field effect transistor" in Appl. Phys. Lett. 54, pages 162 to 164 (1989) by Michael Shur. With this field effect transistor an attempt is made to increase the mean electron speed in the channel either by means of selective electron implantation in the region of the conductive channel close to the drain or by using separate gate electrodes, in order to thereby layout the field effect transistor for operation at higher frequencies. The technology described there requires relatively complicated fabrication and the field effect transistors which are produced are also not suitable for the high operating frequencies which are necessary nowadays.

In addition to this known technology a proposal has been made for a novel field effect transistor by Herr Sakaki in the Japanese Journal of Applied Physics, 21 1381 (1982), namely the so called VMT (velocity-modulation transistor). This transistor is even more complicated to fabricate than the field effect transistor with separate gate electrodes (split gate planar transistor) and to date it has not yet proved possible to realise this transistor with all the expected advantages.

The object underlying the present invention is to provide a method and a field effect transistor of the initially named kind which substantially simplifies the fabrication and which makes it possible to avoid the use of complex mask sets, with the resulting field effect transistors being substantially faster in comparison to the transistors which can be made with known technology. In order to satisfy this object one proceeds methodwise in accordance with the invention in such a way that one divides up the starting structure regionally by linewise destruction of the starting structure by means of a focussed ion beam, through the insulating material generated by the destruction, or treats the starting structure in order to build up lateral potential barriers in the 2D-charge carrier layer and thereby divides the starting structure up regionally, with a channel being formed between at least one closed region and a line lying opposite to the closed region, with the width of the channel lying in the order of magnitude of the thickness of the 2D-charge carrier layer, i.e. of the electron wave length, and with the closed region and also the regions formed on both sides of the line being contacted.

A field effect transistor manufactured in accordance with this method having source, drain and gate electrodes is characterized in that the structure is subdivided into source, drain and gate electrode regions and also into a conductive channel which lies adjacent the gate electrode region by insulating regions of the starting structure which have been formed by linewise destruction or by lateral potential barriers in the 2D-charge carrier layer; and in that the contacting of the individual source, drain and gate regions takes place by respective contacts to the 2D-charge carrier layer in these regions.

This field effect transistor represents a basic jump in speed upwardly compared with current planar technology. As the width and thickness of the conductive channel lies in the order of magnitude of the wavelength of the charge carriers a further reduction of the gate capacity is no longer possible. Accordingly the realization of the IPG transistor of the invention means that the fundamental maximum boundary frequency of transistors in semiconductors has been reached.

Experiments have already been carried out with compositional semiconductors based on $Al_xGa_{1-x}As$, with the 2D-charge carrier layer being a 2D electron gas.

The 2D electron gas is located in the samples which have been investigated in the boundary region between an undoped $Al_{0.3}Ga_{0.7}As$ layer with a thickness of approximately 200 Å and an undoped thicker layer of undoped GaAs, with the electrons originating from a doped layer arranged at the side of the $Al_{0.3}Ga_{0.7}As$ layer remote from the GaAs layer. This doped layer consists in the samples which have been investigated of a layer of $Al_{0.3}Ga_{0.7}As$ of approximately 500 Å thickness which has been n-doped with silicon atoms at a concentration of approximately $10^{18} cm^{-3}$. The basic structure itself was built up with MBE on a gallium-arsenide substrate with the customary buffer layers ("dustbin layers"), with the surface of the starting structure being a [100] surface in Miller indices.

The linewise destruction is generated in accordance with a first variant of the invention by means of a focussed, computer steered ion beam and even with a relatively low ion beam energy pronounced destruction can be found throughout the entire thickness of the samples. One finds that a high quality insulating layer perpendicular to the plane of the semiconductor has been generated everywhere where the destruction has occurred.

A further embodiment comprises a method in which one generates the lateral potential barriers by ion implantation. The p-doping which is achieved in this way forms a kind of n-p-n boundary surface arrangement with the surrounding material which functions as two diodes connected back to back and prevents the flow of current in both directions through the boundary surface arrangement.

As a further alternative the use of an at least substantially homogenous ion beam with an extended cross section is possible, with this beam being directed through a mask consisting of metal or of a thin metallic layer having a pattern of lines corresponding to the desired lines of destruction. This variant, which is set forth in claim 15, offers particular advantages during the manufacture integrated or highly integrated circuits.

When the lateral potential barriers are produced by ion implantation then this ion implantation can take place either by means of a sharply focussed ion beam or with an extended ion beam and a mask.

It is particularly advantageous to subject the starting structure to a heat treatment after producing the regions with linearly destroyed conductivity, with this heat treatment leading to a partial healing of the destruction and to a sharper definition of the insulating lines. In this way the conductive channels can namely be produced in a very narrow manner and subsequently made somewhat broader by the healing process, whereby a very high component density can be achieved on the starting structure.

The DC experiments which have been carried out so far show that the gates are electrically insulated and that leakage currents if present at all lie in the pico ampere range. The gate potential $V_g$ can be varied to $\pm 20$ V without leakage currents recognizably arising and one can probably also operate at considerably higher potentials. The channel resistance R typically amounts, for example with a single electron layer (HEMT) to 5 kOhms at $V_g = 0$ V and changes proportional to 1: $(V_g - V_{th})$ with the channel being completely cut off at the threshold potential $V_{th} = -11$ V (R>1 GOhm). These data only change a little with temperature T and were measured at T=4.2 K and T=300 K in darkness (absence of bandgap radiation).

With the method of the invention one can not only manufacture high quality field effect transistors but rather it is also possible to carry out the method with relatively little effort assuming that one has available a computer controlled sharply focusable ion radiation beam, or makes use of the above mentioned method variant with a mask and an extended ion beam. After the growth of the starting structures by means of MBE, which can take place decoupled timewise from the manufacture of the field effect transistors, the enclosed gate electrode region and also the drain and source electrode regions are written into the starting structure by means of the focussed beam. These regions can then be contacted by the customary diffusing in of contact material, whereby a high quality low ohmic contact is achieved to the 2D electron gas in the individual regions which are insulated from one another. The precise position of the diffused-in contacts is completely uncritical because the 2D electron gas in the individual regions ensures that the applied potentials are distributed over the entire region. Accordingly the manufacture of individual field effect transistors is possible with only a simple mask for the contacting of the individual regions, and even here no special measures need be taken in order to ensure that the contacts are precisely placed.

During the manufacture of individual field effect transistors on individual semiconductor chips the line guidance of the focussed ion beam is even simpler since the side edges of the chip, i.e. the lateral boundary of the same can also be used to surround the enclosed region, i.e. the insulated lines need only run from one part of the lateral boundary to another.

For the formation of the conductive channel it is completely sufficient to introduce a single insulating line into the platelet, it is however important that the end of the line lies opposite to an extended side region or corner region of the enclosed gate electrode region in order to define a trouble free electrical channel.

At this position it should be pointed out that one has already attempted to generate a channel structure on a typical starting structure by means of two written-in insulating lines. This work is described in Physical Review B, Vol. 39, No. 8, Mar. 15, 1989, and indeed in an article by Y. Hirayama, T. Saku and Y. Horikoshi entitled "Electronic Transport through very Short and Narrow Channels Constricted in GaAs by Highly Resistive Ga Implanted Regions". Here however, two lines were aligned opposite to one another so that only a small gap existed between the ends of the two mutually oppositely disposed lines. It was however not possible with the investigated samples to achieve defined and reproduceable measured values, moreover no FET was realized.

In a further embodiment of the method of the invention the said line which separates the source and drain electrode regions from one another can have an angled portion which lies opposite to one side of the rectangular gate electrode region or its corner, with the angled portion and the said side forming the lateral boundaries of the channel.

This formation has the eminent advantage that a channel which is geometrically defined in a problem free manner arises between the angled portion and the rectangular corner region, with only a single gate electrode being necessary.

It is however also possible to so execute the said line that a second closed gate electrode region arises. This embodiment is admittedly unfavorable for applications where the same gate potential is to be applied to both gates because one then requires an external conductive connection between the gate electrodes. It is however also possible to operate the structure with different gate potentials at the two gate electrodes (one potential can be negative, the other can be positive) which leads to an asymmetric potential in the channel, whereby the charge carriers are drawn in the direction of the attractive potential, whereby a lower mobility and thus also a higher channel resistance is achieved. For small gate potential differences it is expected that the change in the charge carrier densities is small, whereby this simple structure is also well suited for a VMT (velocity modulated transistor). As result of the two gate electrode this general structure can also be used for a rapid logic gate.

For simple transistor applications with integrated circuits the previously described embodiments is preferred where the line which lies opposite to the closed gate electrode region does not itself surround a closed gate electrode region. In this case a structure results with three connections and one can also imagine this structure in such a way that a second gate electrode is present but is however short circuited with the source electrode through an internal connection.

In a particularly preferred embodiment, two gate electrode regions are provided wherein one gate electrode region can be connected to the source region. The two gate electrode regions are bounded by respective lateral potential barriers in the 2D-charge carrier layer. Each potential barrier extends around at least one corner, and the channel which connects the source and the drain is formed between oppositely disposed corners of the respective potential barriers. The channel which results is very short and thus has a low effective capacity and a low resistance, so that the component is extremely well-suited for high operating frequencies, for example above 1 THz.

A further preferred embodiment which is important to avoid overheating involves the use of divergent channels. The adjacent sides of the lateral potential which form the channel extend between the source and the drain and diverge in the direction of the potential gradient.

In order to achieve a low output resistance of the device, which is particularly important for operation at high frequencies, this planar gate electrode structure can also be realized with multilayers which cannot readily be depleted with customary planar gate technology.

The method of the invention is furthermore in no way restricted to the manufacture of individual field effect transistors. For example it is entirely possible by corresponding linewise destruction of the starting structure to convert the latter into an integrated or highly integrated circuit. In addition to active semiconductor elements passive circuit elements, for example in the form of resistors and inductors can also be generated by corresponding line guidance of the ionized beam. A resistance can for example be produced by a long relatively narrow channel and an inductor by a sine or, meander or rectangular guidance of two lines which are arranged parallel to one another.

The manufacture of integrated or highly integrated circuits in accordance with the principle of the invention is particularly attractive. This is because both the ultraprecision masks which are otherwise required to manufacture integrated circuits and also the various different manufacturing steps can be largely avoided. It is only necessary to guide the focussed ion beam in accordance with the desired circuit with the integrated circuit being so to say "written" in one manufacturing step into the starting structure, i.e. to the starting chip. Even when using a mask and an extended ion beam for generating the desired linewise destruction only a single mask is required for the entire circuit (plus a further mask for the contacting of the other electrode regions generated with the first mask).

The use of the method of the invention for the manufacture of integrated circuits in principle also offers the possibility of producing cross connections, and indeed in such a way that the semiconductor structure has at least two 2D-charge carrier layers which lie parallel to the surface and which are spaced apart from one another in the direction perpendicular to the surface; and in that the contacting and linewise destruction is so effected that electrical connections arise between the 2D-charge carrier layers and the insulating writing takes place crosswise at different depths (achievable by different ion energies).

Further preferred embodiments of the method of the invention and of the field effect transistors of the invention are to be found in the subordinate claims.

BRIEF DESCRIPTION OF THE DRAWINGS

The invention will now be explained in the following in more detail with reference to embodiments and to the drawing in which are shown:

FIG. 12A–C I-V characteristics as in FIGS. 11A–C however measured at room temperature. In B) and C) the coordinate origin is in the left hand lower corner of the diagram. The double lines and slight loops are artefacts of the characteristic plotter.

DESCRIPTION OF THE PREFERRED EMBODIMENT

Figure 1:
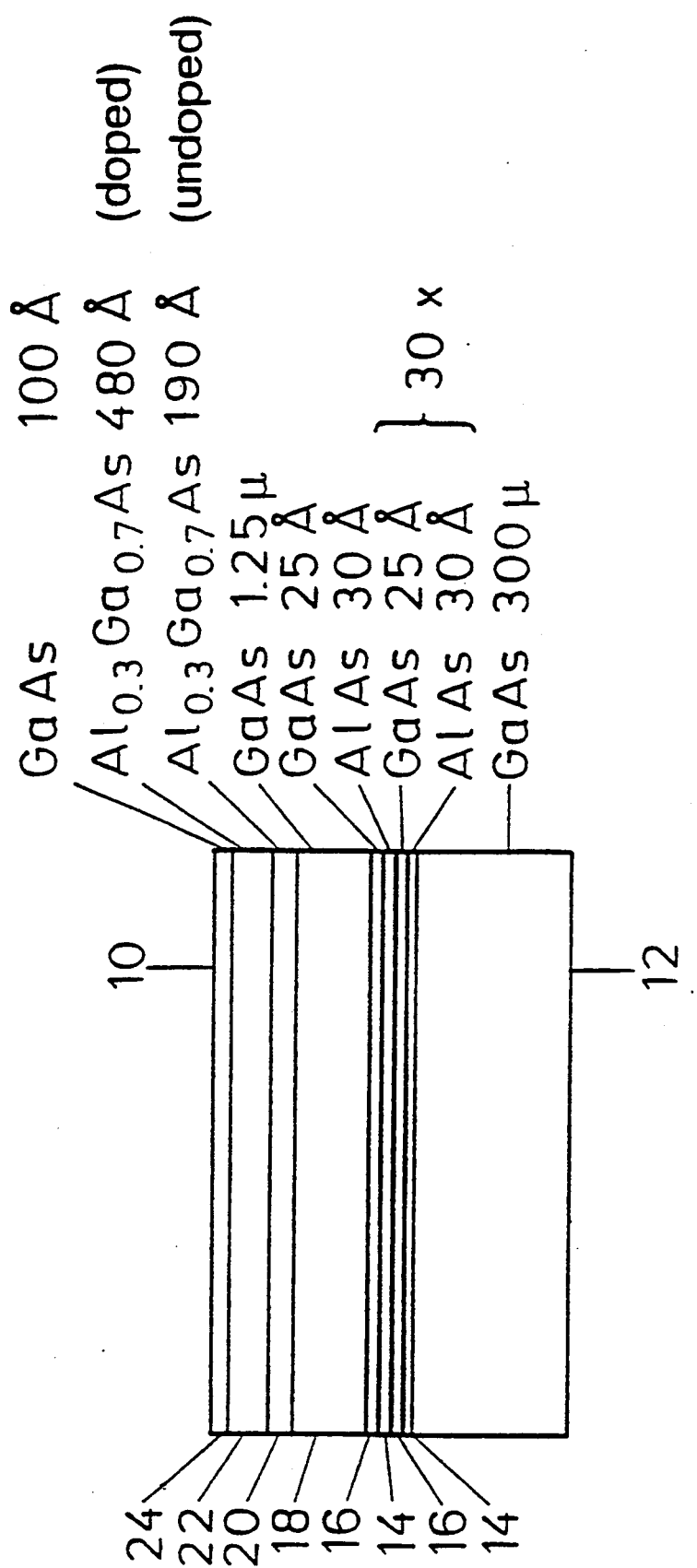
FIG. 1 a cross section through a starting structure which is suitable for the manufacture of the field effect transistors and integrated circuits of the invention, FIG. 2 a band diagram of the active region of the starting structure of FIG. 1, FIG. 3 a schematic plan view of a starting structure such as that of FIG. 1 which has been treated by means of a focussed ion beam for the formation of a field effect transistor, FIG. 4 a plan view corresponding to FIG. 3, however of a modified embodiment, FIG. 5 a diagram of the channel resistance as a function of the applied gate potential in the embodiment of FIG. 3 in which the same potential is applied to the two gate regions, FIG. 6 a customary circuit diagram of a two stage transistor amplifier, FIG. 7 a plan view of a starting structure in accordance with FIG. 1 into which the equivalent integrated circuit of the two stage amplifier of FIG. 6 has been written by means of a focussed ion beam, FIG. 8 a schematic plan view of an alternative embodiment of an FET of a starting structure in accordance with FIG. 1, FIG. 9 a schematic representation of a cross section through the channel of FIG. 8, FIG. 10 at the top a diagram of the gate resistance as a function of the applied gate potential in the embodiment of FIG. 8 in which the one gate was connected to the source, FIG. 10 at the bottom the deviations from a straight line of the conductivity shown in FIG. 10 at the top, FIGS. 11A–C current potential (I-V)-characteristics of an IPG-transistor in accordance with FIG. 8 with $W_{geo}5.2 \mu m$ at T=77K, A) shows the I-V characteristic between the gate and the channel, at $-5.6 V \leq Vg \leq 5.6 V$ the gates are insulated from the channel, B) shows I-V characteristics for the channel for various positive $V_g$ with the middle point of the diagram being the coordinate origin. The curve with the smallest absolute ordinate values corresponds to $V_g=0$ V, the above lying curves correspond to positive Vg in respective 1 V steps ($V_g=1,2,3,4,5$ V); in C) I-V characteristics are shown as in B), however for negative Vg. The curve with the largest absolute ordinate values corresponds to $V_g=0$ V, the lower lying curves to $V_g=-1, -2, -3, -4$ V.

First of all FIG. 1 shows a semiconductor structure of a compositional semiconductor on the basis of $Al_xGa_{1-x}As$. This structure has been grown such that the surface 10 in Miller indices is a [100] surface. The structure comprises a gallium-arsenide-substrate 12 of approximately 300 $\mu m$ thickness which is undoped. On this substrate there are then grown approximately 30 periods of undoped alternating layers of AlAs- and GaAs 14, 16 with however only four such periods being shown for the sake of illustration. These layers form the so called dustbin-layers (buffer layers) which hold back the contamination contained in the substrate at the boundary surfaces, so that the upper buffer layers remain relatively clean. The individual buffer layers are approximately 30 Å thick (AlAs 30 Å, GaAs 25 Å). On these layers a layer 18 of undoped gallium arsenide is then grown with a thickness of approximately 1.25 Åm. This layer 18 is then followed by a layer of $Al_{0.3}Ga_{0.7}As$ of approximately 190 Å thickness, with this layer also being undoped. A further layer 22 of doped $Al_{0.3}Ga_{0.7}As$ of approximately 480 Å is then grown onto this undoped layer 20, with the doping being effected by means of silicon atoms, and indeed with a doping density of approximately $10^{18}$ cm$^{-3}$.

The structure is then terminated with a final gallium arsenide layer 24 of approximately 100 Å, with this layer also being undoped.

Figure 2:
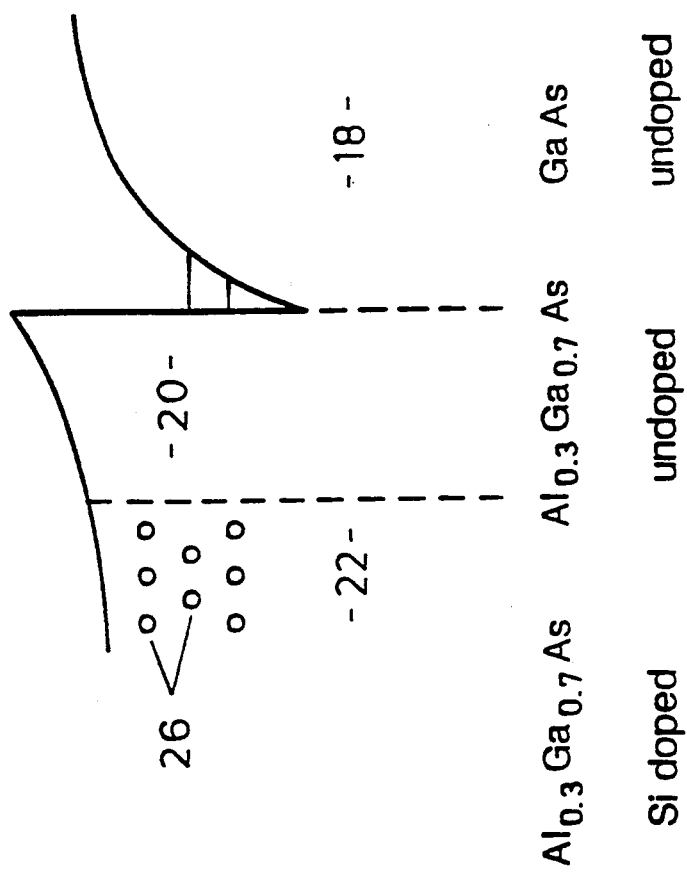

The band structure of the active region of the starting structure of FIG. 1 is shown in FIG. 2. One clearly sees from this band diagram that a potential well forms in the boundary region of the $Al_{0.3}Ga_{0.7}As$ layer 20 and the GaAs layer 18, and that the silicon donor atoms 26 which are spatially separated from this quantum well serve to place electrons into the quantized energy level within the quantum well. The electrons reach this energy level by tunnelling through the $Al_{0.3}Ga_{0.7}As$ layer 20.

Figure 3:
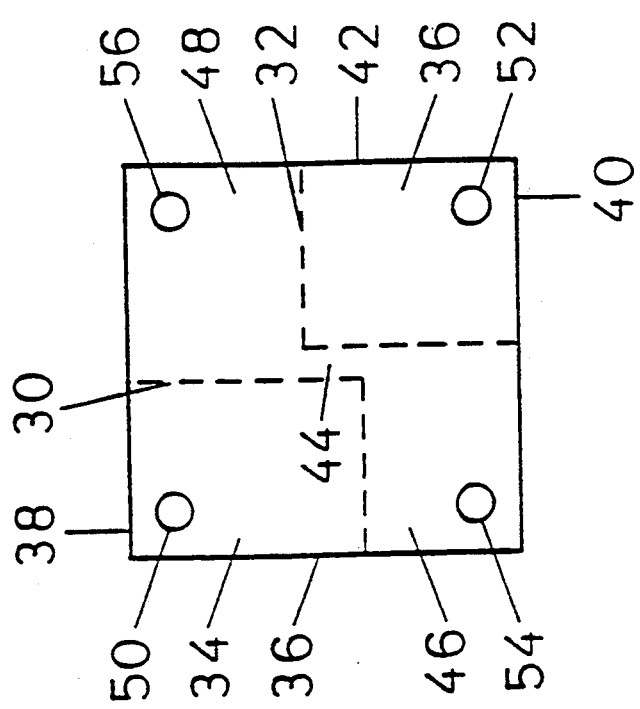

For the formation of the field effect transistor of FIG. 3 a linewise destruction of the starting structure is brought about by means of a focussed ion beam of gallium ions (Ga+) with a beam focus of 0,1 μm, a beam energy of 100 keV and a current density of 10 mA/mm² in a vacuum chamber. In this way linear insulating regions 30, 32 arise which in this example both extend around a right angle and divide the chip with a side length of 100 μm into a source, a drain, a channel and two gate regions. One can imagine the linewise destruction in such a way that the lines are the upper edges of insulating walls which extend through the entire structure perpendicular to the surface of the starting structure. Thus the line 30 surrounds a closed gate electrode region 34 and the line 32 surrounds a closed gate electrode region 35. These regions are not only enclosed in this example by the lines 30 and 32 but rather also by the edge regions 36 and 38 and 40, 42 of the chip.

Between the gate regions there is defined a channel region 44 which extends from a source region 46 up to a drain region 48. The regions 34, 35, 46 and 48 are provided with diffused metallic contacts 50, 52, 54 and 56 which represent the external connections of the field effect transistor. As a two dimensional electron gas is present in each region which extends over the entire width of the region, potentials which are applied to the contacted areas are also applied over the entire respective electrode region.

After the insulating lines have been written in the field effect transistors should be kept in accordance with the invention in the dark. The width of the conductive channel 44 between the two gate electrode regions is approximately 5 μm in the present example, in practice even smaller regions are conceivable, indeed widths under 1 μm.

As previously mentioned the field effect transistor of FIG. 3 can be so operated that the two gate electrode regions 34 and 35 are coupled together by an external conductive connection. One can however also apply different gate potentials to the gate electrodes with the likewise previously described advantages.

Figure 4:
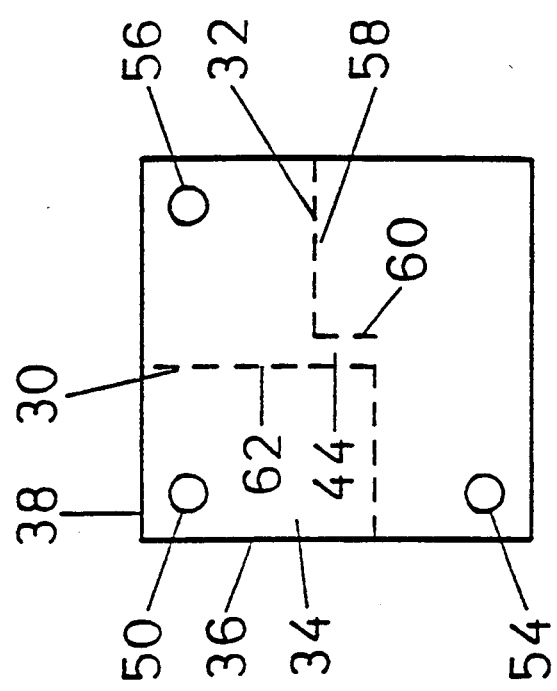

The structure of FIG. 3 can be simplified even further, which is shown in FIG. 4. Here the line 30 is executed precisely as in the embodiment of FIG. 3, the line 32 is however now formed in such a way that it comprises a first portion 58 which extends up to the right side of the chip and of an angled portion 60 which extends parallel to the side 62 of the rectangular gate region. The conductive channel 44 is formed here between the angled portion 60 and the side 62 of the closed gate electrode region 34. This field effect transistor is now contacted at the three positions, 54, 50 and 56 in order to generate electrical connections to the source, gate and drain.

It is also possible to form the line 32 as a simple line so that the end of the line lies pointwise opposite to the side or corner of the closed electrode region 34. The line which in this case would correspond to the line 58 also does not have to be arranged as shown in FIG. 3, it could for example be drawn from the lower right hand corner of the chip up to shortly before the corner of the enclosed gate region 34.

Figure 5:
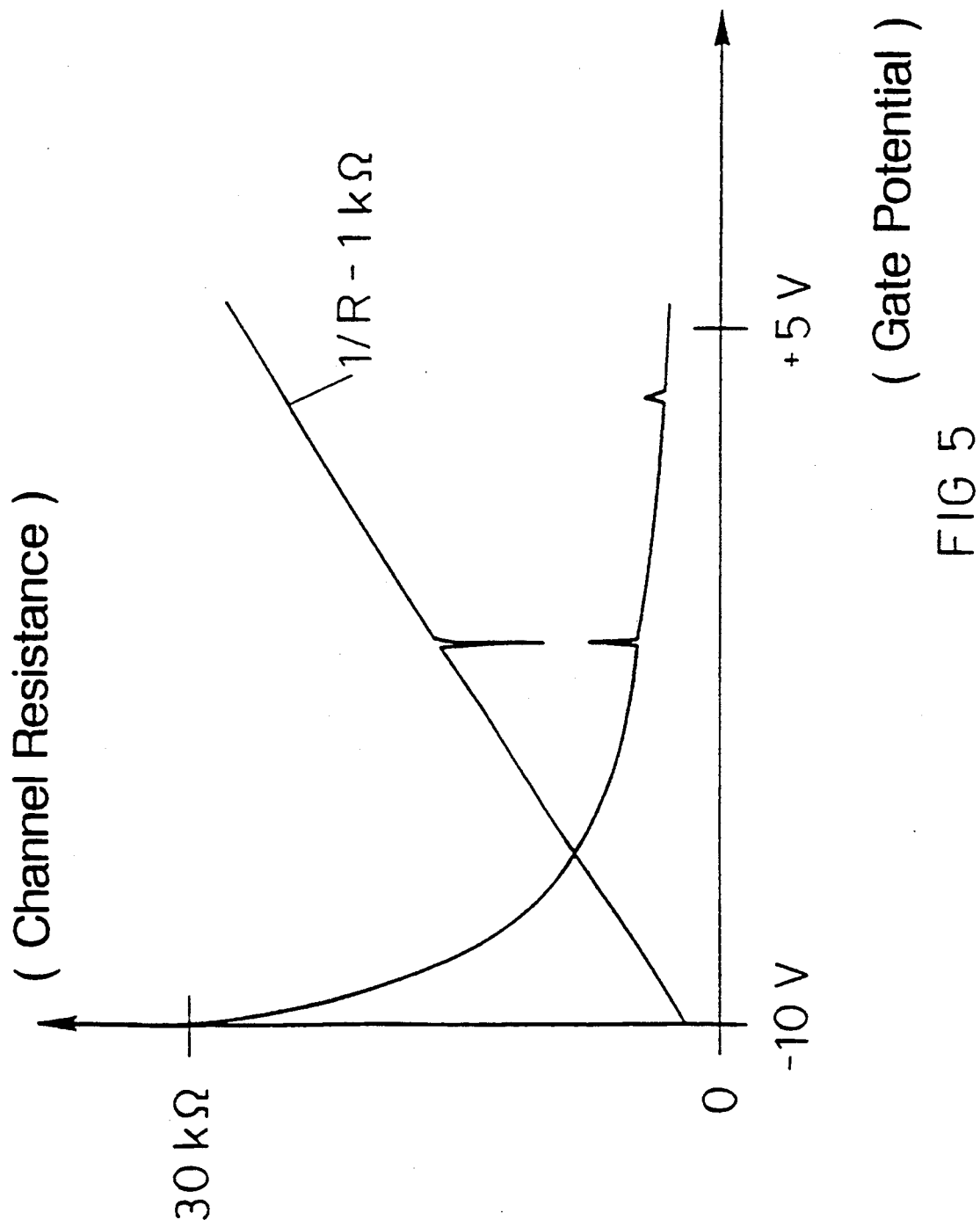

FIG. 5 shows a diagram of the channel resistance as a function of the gate potential in the embodiment of FIG. 3. In the corresponding investigation both gate electrodes 34 and 36 were connected together so that the same gate potential was applied to the two gate electrodes. The peaks 66 which are shown do not belong to the actual measured curve. They were caused by the switching on of other electrical apparatus.

In addition to the somewhat hyperbolic shape of the gate resistance as a function of the applied gate potential the diagram also shows an at least substantially straight line 68 which extends from the bottom left to the top right. Here the reciprocal resistance, the channel conductivity, is shown as a function of the applied gate potential, with the resistance of the feed lines, in this case 1 kOhm, being taken into account. I.e. the straight line shows a value of 1/(R-1 kOhm). The strict linearity of the reciprocal resistance value shows the excellent characteristics of the field effect transistor.

Figure 6:
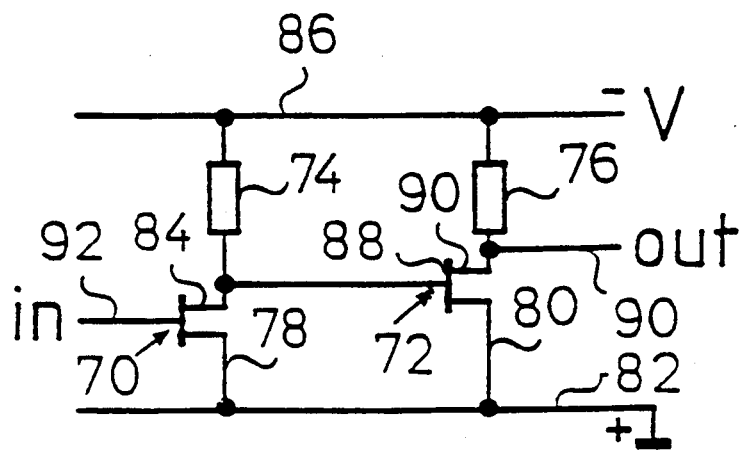

FIG. 6 shows a customary circuit diagram of a two stage amplifier which is formed from two field effect transistors 70 and 72 and also two resistors 74 and 76. The source 78 of the field effect transistor 70 and also the source 80 of the second field effect transistor 72 are connected to the positive terminal 82. The drain 84 of the first field effect transistor 70 is connected via the resistance 74 to the negative terminal 86 and is also connected to the gate electrode 88 of the second field effect transistor 72. The drain 90 of the second field effect transistor 72 is applied in corresponding manner via the resistor 76 to the negative terminal 86. A signal to be amplified is applied to the input of the circuit to the gate electrode 92 of the first field effect transistor 70 and the amplified output signal is obtained from the drain 90 of the second field effect transistor 72.

Figure 7:
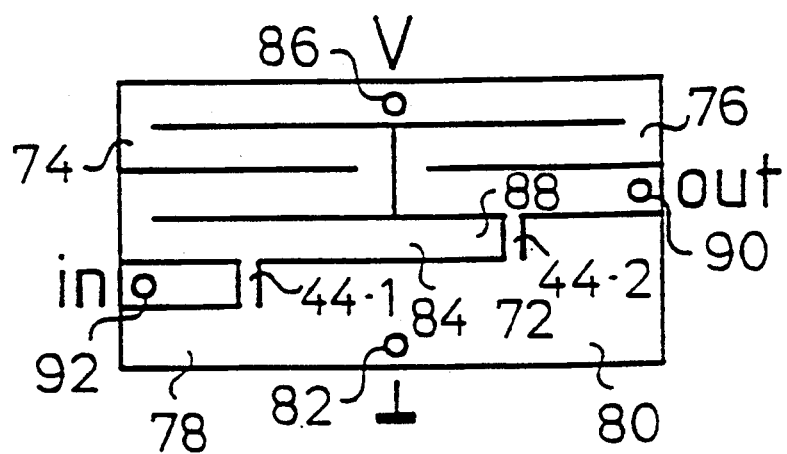

FIG. 7 shows how this two stage amplifier can be realized on a single chip by means of the method of the invention. For a simpler understanding the individual reference numerals of the equivalent circuit diagram of FIG. 6 have been entered into the drawing of FIG. 7 and FIG. 7 is aligned vertically with FIG. 6 and has the same scale in the vertical direction. Lines in FIG. 6 signify conductive connections whereas in FIG. 7 they symbolize insulating regions. In this case the chip has a rectangular form with all the lines which lie within the lateral boundary of the rectangular chip 94 being written in by a focussed ion beam in the previously described way and means. The regions 78, 80 represent a common source region which is contacted at 82. I.e. the positive potential is applied at 82 and is distributed to the source regions 78 and 80 which are connected to one another as result of the 2D electron gas. The negative terminal is applied at 86 at the centre of the upper field of the chip. The input potential is applied at 92 and the output signal is extracted at 90. I.e. 82, 86, 90 and 92 are contacts to the respectively associated regions of the chip.

The region 84 represents the drain electrode of the first field effect transistor 70, the conductive channel 44.1 is defined between the two oppositely disposed and closely spaced insulating lines between the reference numerals 92 and 84. The drain region 84 leads to the left, up the left hand lateral boundary of the chip, then to the right up to the centre of the chip, and then again to the left and back to the right up to the connection terminal 86. The width of this total path is so laid out that a resistor 74 hereby arises.

The two parallel lines lying closely adjacent one another at the right hand side of the chip lie between the reference numerals 84 and 90 and represent the channel 44.2 of the second field effect transistor 72. The drain 90 of the second field effect transistor 72 is connected with the negative terminal 86 via a meander shaped path which represents the resistor 76 and is laid out in accordance with the resistor 74 (however with mirror image symmetry thereto). As a result of this meander path inductivity is associated with the resistors in this embodiment.

With the invention a unipolar electronic component with a quasi one dimensional carrier channel is proposed which has all the characteristics of an FET. This component can be very simply manufactured, has "self alignment" and linear instead of planar gates with very low capacity. In this way a very high operating frequency is possible. The structure consists of an initially homogenous 2D layer with a high carrier mobility which is produced by epitaxy of for example GAAS. The implantation of accelerated focussed ions (for example Ga+ with 100 keV) locally destroys the conductivity of the electron layer. The irradiated regions remain insulating at low temperature or room temperature even after illuminating the crystal with bandgap radiation. This writing in of the insulating layer is effected along two paths (30, 32) on the platelet so that a 2D-carrier layer is subdivided into three regions which are insulated from one another. The source and drain are only connected via a narrow channel (44) the width of which can be continuously tuned by a gate potential which is simultaneously applied to both gates (34, 36) relative to the source, so that a pronounced change of the carrier concentration and thus of the channel resistance arises.

In the component the electric constriction field exists parallel to the 2D-layer and the destroyed insulating region serves as a dielectric. By increasing a negative gate potential lying in the plane the extent of the electric field rapidly overcomes the destroyed almost insulating region alongside the path effected by the ion beam. The carriers are thus restricted to a quasi one dimensional channel of the initially high quality chip and the gate potential influences only the charge carrier density, not however the high mobility. This can be very important for ballistic transport where large free mean path lengths are required.

In the following the invention will be explained in further detail with particular emphasis on technological and scientific aspects which are important to the invention.

The present day technology of field effect transistors is based exclusively on the "planar" field effect, i.e. the gate which influences the electronically inductive layer forms a plate capacitor with this layer. It is only recently that the inhomogenous scattered field at the edges of such gates has been exploited in basic research to generate quasi one dimensional channels. The disadvantage of these surface gates is that the inherent capacities are large and thus the maximum working frequencies are restricted. Moreover, the manufacture of such laterally restricted layer structures is relatively complicated, in particular the sub-$\mu$m-precise positioning of the source and drain relative to the gate. The IPG transistor proposed here does not have these disadvantages and can moreover be rapidly manufactured in a single technology step without masks and chemical processes. In this way the positioning problems are completely avoided.

Figure 8:
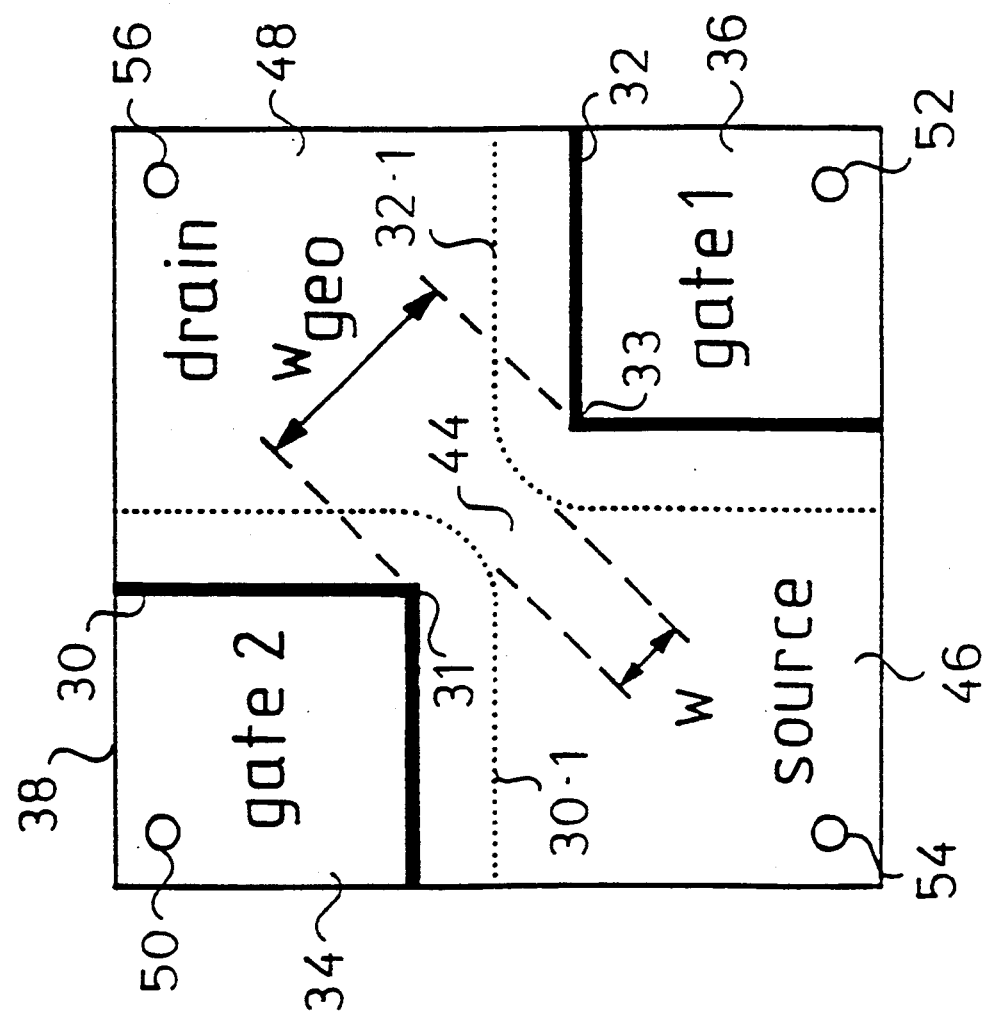

The basis for the manufacture of the new structure is the lateral local passivation ("insulating writing") of the conductivity of an originally homogenous electronic layer at the boundary surface of a heterostructure, preferably of a $Al_{0.3}Ga_{0.7}As$-GaAs heterostructure. In a heterostructure of this kind the energy band discontinuity between the $Al_{0.3}Ga_{0.7}As$ and the GaAs leads with suitable doping to band bending in which an electron edge layer is formed just beneath the crystal surface. This electron edge layer has a thickness of 10 nm (which corresponds approximately to the De Broglie wavelength of the electrons) and is so thin that quantum effects perpendicular to it are important and one speaks of a two dimensional electron gas (2DEG). The insulating writing in the 2DEG can for example take place with a finely focussed Ga+ ion beam (focussed ion beam, FIB) with 100 keV energy, 100 nm focussed diameter. One can in this way "cut" the electrical conductivity of the 2DEG into desired regions with the ion beam. One uses this insulating writing in accordance with FIG. 8, with an ion beam incident perpendicular to a heterostructure, to write two lines which divide the 2DEG into three regions gate 1 (35), gate 2 (34) and the source and drain regions 46, 48 which are connected by a very narrow channel 44. As the structure of FIG. 8 corresponds to that of FIG. 3 the same reference numerals have been used for the same parts. The basic structure corresponds in other respects fully to that of FIG. 1. One notes that in the embodiment of FIG. 8 the insulating lines 30 and 32 formed by the ion beam are so arranged that the respective corners 31, 33 lie opposite to one another which represents a very advantageous arrangement as the channel has an ideal form and the shortest possible channel arises.

Figure 9:
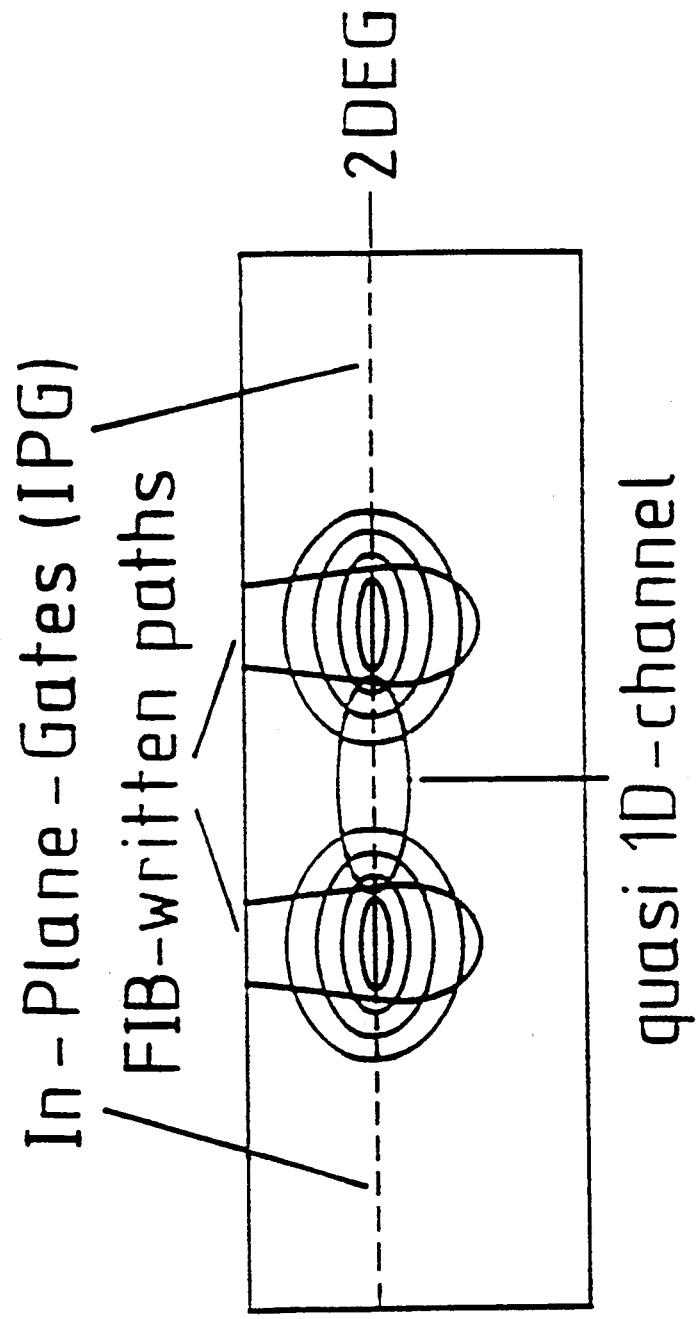

A narrowed region arises between the source and the drain the effective electrical width w of which is smaller than the smallest spacing $w_{geo}$ between the FIB lines. The chain dotted lines 30.1 and 32.1 represent the boundary between the non-destroyed crystal structure and the destroyed structure and take account of the fact that the destruction by the ion beam goes beyond the linear region 30, 32 characterized by the solid lines. In as much as the regions of the 2DEG to the right and the left of this channel (gate 1 and gate 2) are electrostatic gates to which a gate potential $V_a$ is applied relative to the channel (source terminal) w can be varied from a few μm down to zero. The distribution of the electrical field E in this structure is shown by FIG. 9. It can clearly be seen that E lies predominantly in the plane of the 2DEG and thus the channel can be efficiently constricted from both sides. The concentric ellipses to the left and right of the quasi one dimensional channel in the middle indicate the electrical field distribution which forms as result of the applied gate potential. As a result of the low extent of the 2DEG in the crystal growth direction (ca. 10 nm) and also of the lateral corners of the gate there is additionally an increase in the field (tip action) in the vicinity of the channel which favors this process. The special feature of the structure is not only the simple manufacture of quasi one dimensional conductive channels but rather also the method of producing gates from the same conductive structure as well as the. channel, namely from the 2DEG. In this way the controlling element "gate" has the same structure as the controlled element "channel". This important principle could be compared with a development which was made at the end of the 1950ies in information science as one recognized that controlling and controlled elements (programs and data) are most effectively exploitable when they coexist in the memory with the same priority. It is to be expected that the identity of structure of the gates and channels of the invention as realized with the IPG transistor in high integrated circuits will initiate a comparable new epoch of development in microelectronics as took place in the past in information science.

It is particularly interesting to investigate the gate-channel capacity. For a short channel IPG structure with $w_{geo}=4.2$ μm a one sided gate channel capacity C=100 fF has been measured. The effective gate region is approximately 100 times shorter than the 350 μm long FIB line, thus the effective capacity $C_{eff} \approx 1$ fF.

One can also at least roughly estimate the capacity by theoretical considerations.

The starting electron density on the heterostructure is $n=3\times 10^{11} cm^{-2}=3\times 10^{15} m^{-2}$. With $w_{geo}=4.2$ μm the channel region influenced by the gate may be about $2\times 2$ μm large that is $4\times 10^{-12} m^2$. Multiplied by n that results in approximately 12000 electrons which can be cleared away with a threshold potential of $V_{th}=-4$ V. The capacity is thus $12000 \cdot e/4$ V $\approx 0.5$ fF, which is in surprisingly good agreement with the above measured value.

The gate resistance amounts at room temperature to approximately $R_g=1$ kΩ/□. Multiplied by $C_{eff}$ this results in a time constant of $R_g \cdot C_{eff}=1$ ps, i.e. this structure can operate at a frequency of 1 THz. At low temperatures Rg drops once again by approximately two orders of magnitude so that one can reckon with approximately 100 THz!

Figure 10:
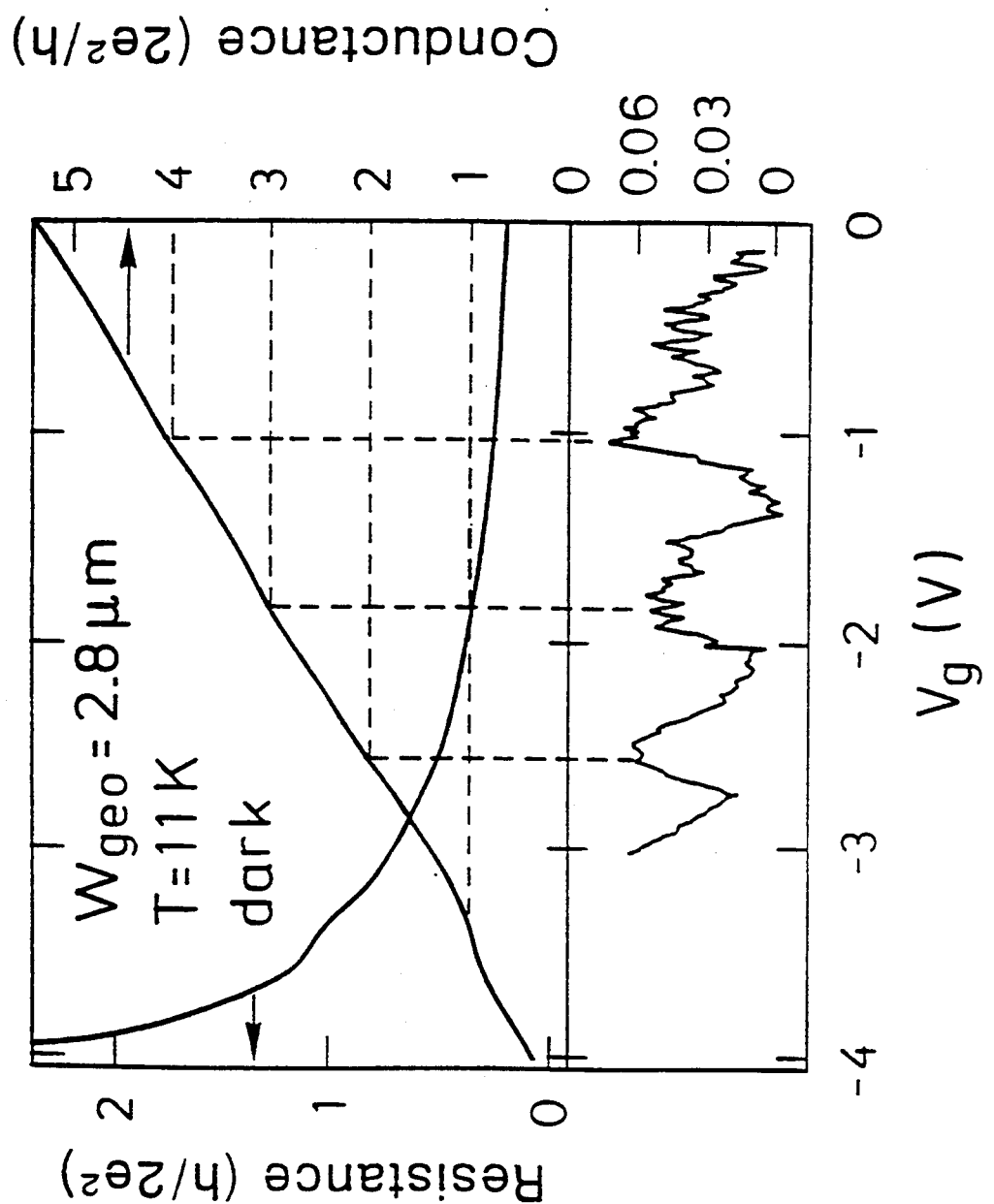

The resistance or the conductivity of the IPG channel is shown in FIG. 10 as related to the gate potential $V_g$, where the $w_{geo}=2.8$ μ. FIG. 10 corresponds essentially to FIG. 5 was however recorded with a somewhat more sensitive measuring apparatus at the temperature of 1.1 K, and indeed with an FET with a construction in accordance with FIG. 1 and insulating regions in accordance with FIG. 8. The conductivity is essentially proportional to $V_g-V_{th}$, with $V_{th}$ being the cut off potential of $-4.1$ V at which the channel is completely cut off (insulating). At low temperatures as in FIG. 10 equidistant structures are however superimposed on this straight line and occur at an integral multiple of the elementary conductivity of $2e^2/h$. This observation is a proof of the fact that a considerable part of the electrons which pass through the channel is ballistic i.e. do not experience any scattering at dislocations or phonons. This shows that the high quality of the starting structure was maintained in the channel region during FIB structuring. The transport takes place through m one dimensional sub-bands in the channel and m can be varied in the FIG. 10 between 1 and 4. In order to better resolve these structures for $m \leq 2$ which can arise through ballistic transport in one dimensional sub-bands the difference between the measured conductivity and a theoretical straight line is recorded in the lower part of the FIG. 10 to an enlarged vertical scale. The channel length is of the order of magnitude of the radius of curvature of the coulomb potential formed by the gate, i.e. a few μm. Thus it is understandable that the quantisation steps are not as sharply resolved as in short channel geometries.

These ballistic effects are only observed at temperatures of $T \leq 10K$ and source drain potentials $V_{SD} \leq kT$. The IPG transistor is however also capable of operating in the classic boundary case at substantially higher temperatures T and indeed at source-drain-potentials $V_{SD} >> kT$. FIG. 11 shows drain current-$V_{SD}$ families of transistor characteristics of the FET of FIG. 8 for $-1 V \leq V_{SD} \leq 1$ V and $T=77$ K at different $V_g$, with $w_{geo}$ here being 4.2 μm. The channel is "normal on" (i.e. conductive at Vg=0 V) and can thus be enriched for its positive $V_g$ and also depleted with negative $V_g$. At $V_g=-4$ V the channel is practically insulating. The family of characteristics is symmetrical about the zero point since $V_{SD} \leq V_g$. At $V_g=+5$ V the channel resistance amounts to 6 kΩ, at Vg=$-4$ V it lies above $10^7$ Ω.

The individual pictures can be explained as follows:

A) shows the I-V characteristic between the gate and the channel at $-5.6 V \leq V_g \leq 5.6$ V the gates are insulated from the channel. B) shows I-V characteristics for various positive values of $V_g$, with the centre point of the diagram being the coordinate origin. The curve with the smallest absolute ordinate values corresponds to $V_g=0$ V, the above lying curves correspond to positive $V_g$ in respective steps of 1 V i.e. to ($V_g=1, 2, 3, 4, 5$ V). In C) I-V characteristics are shown as in B) but for negative $V_g$. The curve with the largest absolute ordinate values corresponds to Vg=0 v, the lower lying curves to $V_g=-1, -2, -3, -4$ V.

FIG. 12 shows families of characteristics for the same IPG structure, (i.e. the structure of FIG. 8, as modified for the measurements of FIG. 11), at room temperature and at larger source drain potentials $V_{SD}$ of up to 5 V, which are comparable with the applied gate potentials. In B) and C) the coordinate origin is in the lower left hand corner of the diagram. The double lines and the slight loops are artefacts of the characteristic plotter. With these results proof is provided of the fact that a transistor of this kind can drive a further transistor which is a basic requirement for its use in integrated circuits. A further technological detail are the two gates in FIG. 8 which were previously connected in parallel: for this purpose an external cross connection is necessary between gate 1 and gate 2 which can make itself disturbingly noticeable in particular with high integration. The problem can be elegantly solved in that for example gate 1 is connected to the source (by partial omission of the FIB line between the channel and the lower edge of the sample in FIG. 1). In this way the electrical potential transverse to the channel is asymmetrical, i.e. the electrons are pressed with negative gate potentials at the remaining gate 2 towards the insulating FIB line at the previous gate 1. In actual fact the characteristics in FIGS. 11 and 12 were recorded in this configuration. In addition to the realization of a true three terminal component this arrangement also has the further advantage that the crystal quality, and thus the charge carrier density n and mobility $\mu$, gradually reduce in the direction towards the FIB written barriers. In this way the electrons are displaced at negative gate potentials more and more into regions in which not only n but also $\mu$ is reduced. This modulation of the mobility makes itself notable in a change of the conductivity of the channel which does not result through charge transfer processes (speed modulation). Accordingly the response of the IPG (in plane gate) transistor is rapid and high working frequencies can be achieved. Furthermore the geometry of the IPG arrangement brings about a decisive reduction of the internal capacities; while a conventional FET represents a capacitor of overlying layers (gate and 2DEG) the IPG transistor comprises layers which lie alongside one another (FIG. 9) which have a gate capacity which is of an order of magnitude lower than with the conventional FET.

A substantial strength of the IPG principle of the invention lies however not only in the tunability of the conductivity of the channel and the broad bandwidth of the frequency behaviour but rather also in the integrability of the structure. FIG. 6 has already shown a simple circuit which can be directly converted into a FIB written pattern (FIG. 7). The focussed ion beam can write IPG transistors, resistors, capacitors and inductors in one working step without stopping and these are immediately operational after they have been written. It is indeed possible to vary the depth of penetration of the ion beam with the ion accelerating potential and thus to selectively laterally structure 2DEG layers which lie at different depths, for example in order to produce cross connections. The speed of writing of the JIBL-100A ion beam welter that is used amounts to a maximum of 0.3 m/s, so that with the laboratory device which is already available, and starting with $2 \times 2$ $\mu$m large IPG transistors, one could write $10^6$ transistors in 10 s!

Having regard to the approximately 500 process steps required for conventional IC production—which must he compared with a single step for integrated IPG circuits—the sequential writing with a focussed ion implanter even becomes attractive for production. Moreover, complex IPG circuits can also the generated With conventional large area ion implanters with masks. The possibility of manufacturing a highly integrated chip in microseconds makes it possible to understand the relevance of ion implantation for the future manufacture of microstructures.

Figure 14:
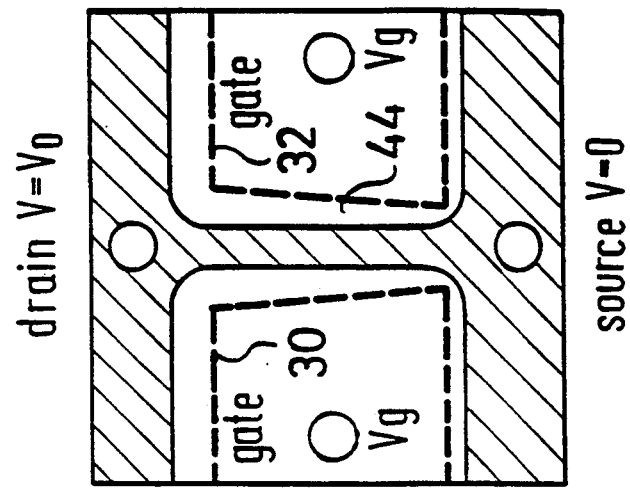
Figure 13D:
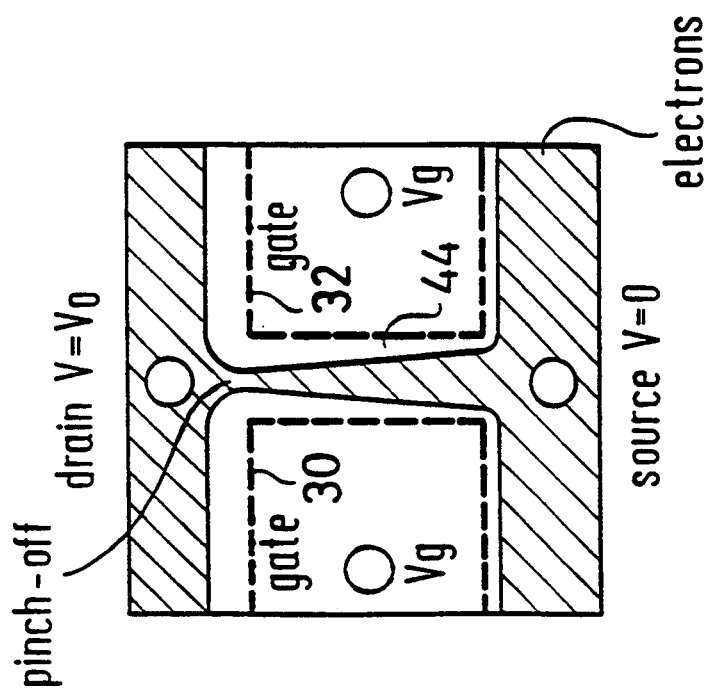
FIG. 13A a plan view of an alternative embodiment of an FET in accordance with the invention, FIG. 13B a representation of the shape of the potential distribution along the X-direction in FIG. 13A, FIG. 13C a schematic representation of the potential $V_g$-V in the direction X in FIG. 13A which determines the strength of the E-field, FIG. 13D the constriction of the channel caused by the potential distribution of FIG. 13C, FIG. 14 an improved shape in comparison to FIG. 13A of the sides of the gate electrode regions of an FET of the invention which form the channel, FIG. 15A an OR-gate manufactured in accordance with the invention, FIG. 15B the equivalent circuit diagram for the OR-gate of FIG. 15A, FIG. 16A an AND-gate produced in accordance with the invention, FIG. 16B the equivalent circuit diagram for the AND-gate of FIG. 16A, FIGS. 17A and B an alternative version of the OR-gate and of the AND-gate of FIGS. 15A and 16A respectively.

FIG. 13A shows a possible configuration of the insulating lines 30, 32 which determine the gate regions. With a long channel 44 and a larger source—drain potential, a potential drop arises along the channel (direction x) which is shown in FIG. 13B. If one now considers the value $V_g$-V as a function of x (FIG. 13C) then it is evident that the E-field at the drain end of the channel is greater than at the source end, so that the current distribution in the channel is not uniform but rather exhibits a constricted "pinch-off" behaviour as shown in FIG. 13D. This is undesirable since it leads to local overheating and premature failure of the component or of the circuit. In order to provide help here the arrangement of FIG. 14 is preferred. Here the "pinch-off" behaviour is controlled by the use of an approximately trapezoidal channel 44 which diverges in the direction of the potential gradient, i.e. the channel does not break away as described at its upper end but is instead uniformly narrow over its entire length. In this-way "hot" regions at the end of the channel are avoided at highly negative gate potentials near to the cut off potential $V_{th}$. The trapezoidal shape (linear processing) only brings about a coarse homogenization of the current density in the channel and other shapes (hyperbola, 1/x, exponential $e^x$ etc.) offer better effects. All variants lead to a diverging shape in the direction of the potential gradient. This model actually only applies for a particular working voltage $V_o$. With deviations from $V_o$ it is less ideal but is still much better than without broadening over the length x.

FIG. 14 shows therefore an alternative shape for the gate regions with a diverging shape in the direction of the potential gradient which in practice has a substantial advantage over a rectangular shape. The illustrated "pinch-off" behaviour modelling by trapezoidal (or more complicated channels) also functions with a one-sided gate (three terminal device).

Figure 15:
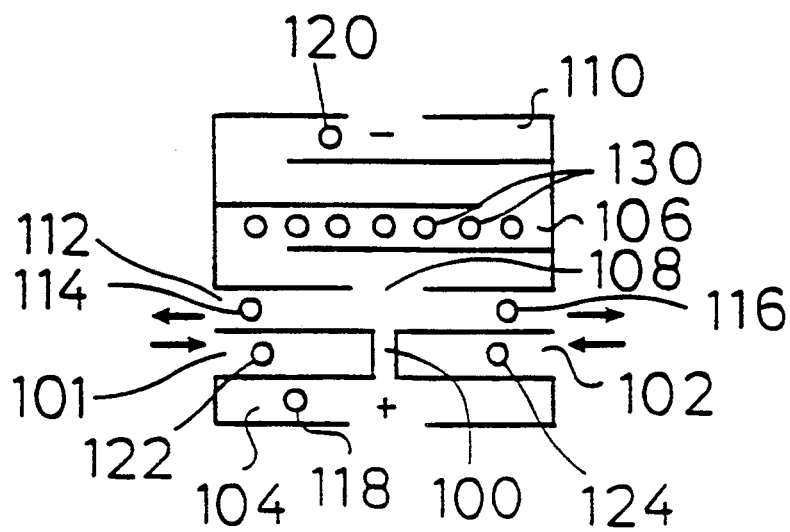
Figure 15:
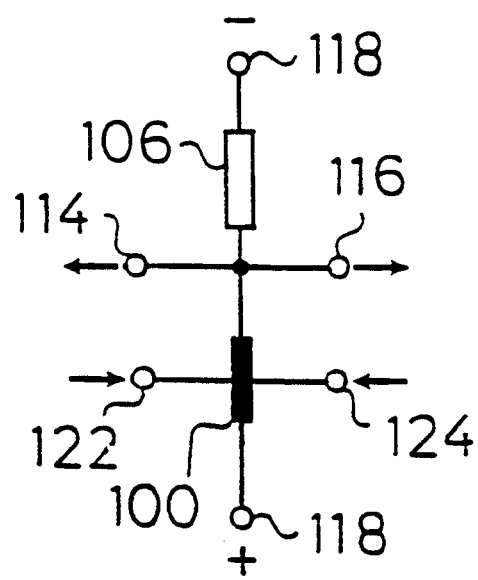

FIG. 15A shows an example for an OR-gate which can be realized in accordance with the invention, for example as part of a highly integrated circuit (LSI). The equivalent circuit diagram is shown in FIG. 15B. The line guidance for the insulating regions is so selected that a channel 100 is formed between two gate regions 101, 102. Beneath the channel 100 there is located a connection region 104 which is connected to a positive terminal of a voltage source. Above the two gate regions 101, 102 there is located a meander-like resistance path 106 which leads from a start 108 lying opposite to the mouth of the channel up to a region 110 which is connected in operation to a negative terminal of the potential source. The region 112 between the channel 100 and the input 108 is contacted at two positions 114, 116 and these equivalent contacts, which represent two alternative equal value output terminals of the OR-gate, always have the same potential. In corresponding manner the regions 101, 102, 104 and 110 are provided with respective contacts 122, 124, 118 and 120 respectively. For the sake of the representation the side edges of the square chip are not drawn in at the level of the gate regions 101, 102 or at the level of the output region 112.

In order to facilitate the association of the contacts to the equivalent circuit diagram of FIG. 15B the connection sources in the equivalent circuit diagram are provided with the same reference numerals as in FIG. 15A. All black regions are produced by insulating writing with the exception of the side edges of the chip. When the OR-gate represents only one component on a chip then it can for example be produced in such a way that the square framing is closed at all sides apart from the positions where connections takes place to other components. For this reason no insulating regions are shown at the sides of the component at the level of two gate regions 101, 102 and of the output region 112. It is naturally not necessary when using the component on one chip to individually contact these regions since as a general rule the potential supply to these regions or the potential take off from these regions takes place via connections to other components, i.e. via the two dimensional charge carrier layer.

If no potential is applied to the regions 101, 102, then the input region 104 is connected with the output region 110 via the region 106 forming the resistor, so that the channel 100 and the resistor region 106 form a potential divider and the corresponding potential can be tapped off at the contacts 114, 116. As the resistance of the channel in the open state is very low in practice the potential in the drain region 112 corresponds to the source potential. If however a control potential is applied to the region 101 and/or to the region 102 then this control potential serves to completely block the channel region 100, so that the potential in the region 112 corresponds to the potential prevailing in the region 110. I.e. the application of a potential to one or more of the two gate regions has changed the output potential from high to low so that the function of an OR-gate is present. In FIG. 15B the resistance which corresponds to the region 106 is likewise characterized by the reference numeral 106 and the channel 100 is drawn in with the solid vertical line which for easy comprehension likewise carries the reference numeral 100. One can imagine this solid line 100 or the channel 100 in such a way that it is formed by two FETs the gate electrodes of which are connected together.

Figure 16A:
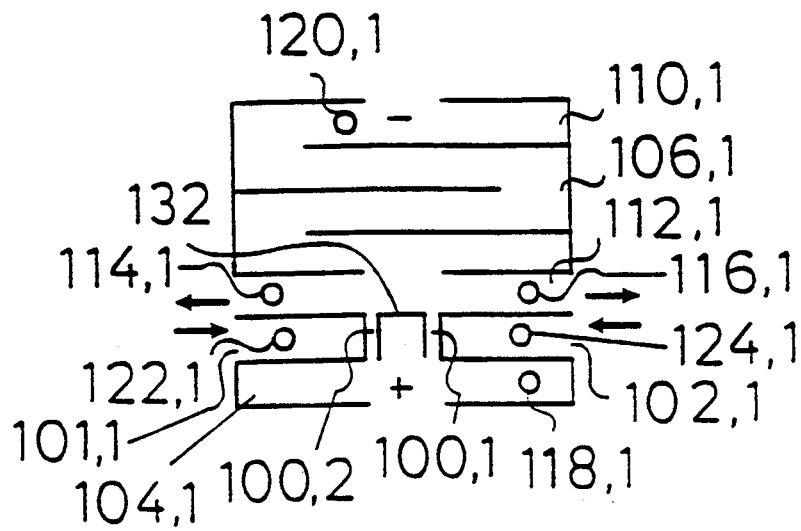
Figure 16B:
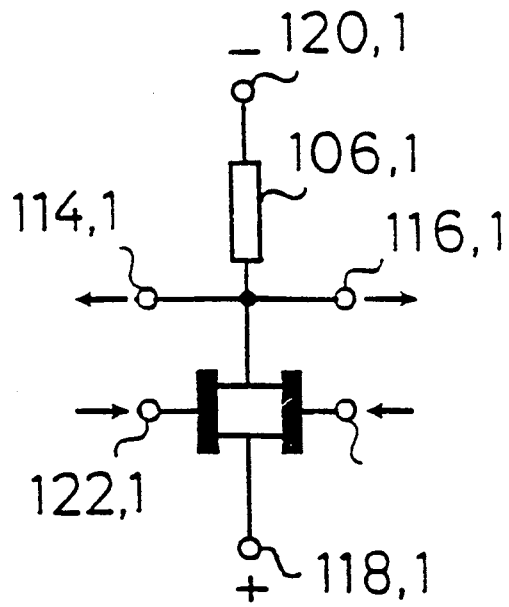

FIG. 16A shows an AND-gate 130 with FIG. 16B showing the equivalent circuit diagram for this AND-gate. One notes that the construction of the AND-gate is similar to that of the OR-gate which is why the same reference numerals have been used for corresponding regions, however with the addition 0.1. In distinction to the OR-gate of FIG. 15A two channel regions 100.1 and 100.2 are however provided here, which are respectively formed between one of the electrode regions 101, 102 and a central n-shaped insulating line 132. If a controlled voltage is applied here to one of the contacts 122.1 or 124.1 then only the respectively associated channel 100.1, 100.2 is closed whereas the other channel remains conductive and the component act as a potential divider so that a corresponding potential can be tapped off at one or more contacts 114.1, 116.1. If in contrast control signals are applied to the two gate regions 100.1, 102.1 then both channels 100.1, 100.2 are depleted and the potential in the region 112.1 corresponds to the potential in the region 110.1. From this description one can see that the component functions as an AND-gate. In the equivalent circuit diagram of FIG. 16B one can also imagine the two channels 100.1, 100.2 as if they were formed by two FETs which are connected together source to source and drain to drain.

As mentioned in connection with FIGS. 15A and 16A the components function in the inductive state as a potential divider. By a suitable choice of the resistance 106 this is substantially larger than that of the channel 100 or of the channels 100.1, 100.2. In this way the potentials in the region 112, or in the region 112.1 respectively correspond to the positive supply potential in the region 104 and 104.1, so that a whole series of such gates can be linked up in a chip without pronounced voltage losses arising.

Figure 17A:
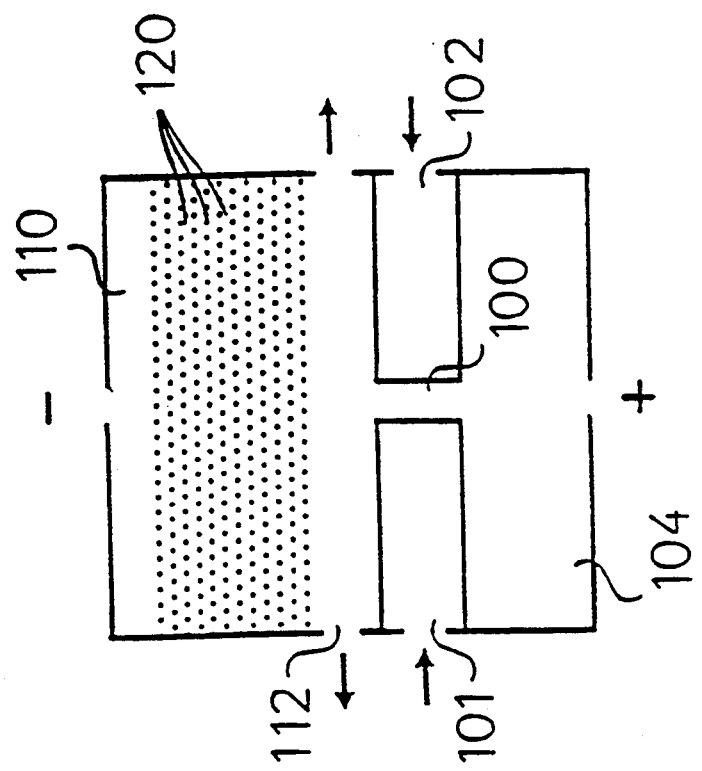
Figure 17B:
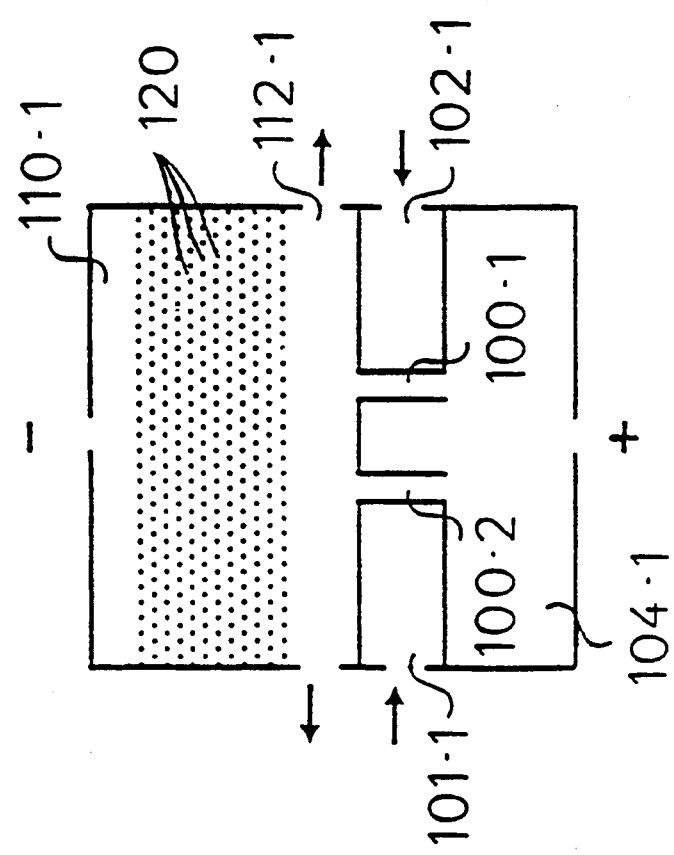

Instead of the resistor 106 or 106.1 being formed by a meander-like path, which leads to inductivity, one can also place a series of "stones" i.e. insulating regions into a conductive region by means of the ion beam, as for example shown at 130 in FIG. 15A, whereby the resistance of this region is likewise increased. In practice many many more "stones" 130 are necessary and they are placed in accordance with a point array onto the chip in accordance with FIG. 17A and 17B in place of the meander-like path.

With this description it has been made clear that one can also straightforwardly produce logic components by means of the invention. Actually one can also form any other known kind of gate by a suitable line guidance of the insulating regions and can also combine such gates with one another on one chip in order to generate an integrated or highly integrated circuit (LSI), which can naturally also be equipped with other active and passive circuit elements which can likewise be manufactured by means of the method of the invention.

As already mentioned it is not absolutely necessary to form the insulating regions with a sharply focussed ion beam, but rather one can form a mask by photolithography and then expose the base structure in accordance with FIG. 1 by means of an extended ion beam through the mask in order to achieve corresponding linear destruction. In so doing the mask can either be a separate thin metal foil which is laid on to the surface of the chip or it can be produced on the surface of the chip itself by photolithography. The apertures in the mask correspond in position and layout to the desired lines of insulation on the chip.

At all places where the FIB beam does not directly bound the channel (touch it) a substantially broader FEB line can be written in order to improve the electrical break-through behaviour at the large gate potentials and to reduce the total capacity of the gate or gates relative to the source and drain.

We claim:

1. A method for generating an active semiconductor structure from a starting structure having a surface and a two-dimensional charge carrier layer substantially parallel to said surface, the method comprising the steps of:

a) treating the starting structure to form lateral potential barriers in said two-dimensional charge carrier layer, said lateral potential barriers acting as line-like insulating boundaries extending through said two-dimensional charge carrier layer whereby to divide up said starting structure into at least one source region, at least one drain region, at least one gate region and at least one channel region extending between said source and drain regions and adjacent to said gate region, with said channel region having a width lying in the order of magnitude of the thickness of the two-dimensional charge carrier layer, i.e. of the electron wavelength, and (b) forming contacts to said two-dimensional charge carrier layer at said source, drain and gate regions.

2. A method in accordance with claim 1 wherein said channel region is formed between a first boundary line surrounding said gate region and a second boundary line lying opposite to said first boundary line said first boundary line being spaced from said second boundary line by a region of said two-dimensional charge carrier layer defining said channel region.

3. A method in accordance with claim 2 wherein said first boundary line surrounding said gate region is configured to include a corner, and said second boundary line is configured to have an end portion opposite to said corner and cooperating therewith to define said channel region, and wherein said source and drain regions are provided on opposite sides of said second boundary line.

4. A method in accordance with claim 3 wherein said end portion of said second boundary line comprises a tip portion thereof.

5. A method in accordance with claim 3 wherein said end portion of said second boundary line comprises an angled portion thereof lying opposite to a side of said first boundary line adjacent said corner.

6. A method in accordance with claim 3 wherein said first boundary line is configured so that said corner comprises a rectangular corner.

7. A method in accordance with claim 2 wherein said second boundary line is configured to define a second gate region and wherein an external conductive connection is produced between said first and second gate regions.

8. A method in accordance with claim 7 wherein said first boundary line surrounding said first gate region is configured to include a first corner and said second boundary line forming said second gate region is configured to include a second corner, said first and second corners being disposed in juxtaposition but spaced apart from one another, with said channel region being defined between them.

9. A method in accordance with claim 1 wherein said first boundary line is configured to have first and second ends which extend up to a side edge of said starting structure, and wherein said second boundary line is configured to have at least one end which extends up to a further side edge of said starting structure.

10. A method in accordance with claim 9 wherein said second boundary line is configured to have first and second ends which extend up to at least one side edge of said starting structure.

11. A method in accordance with claim 1 wherein one fabricates said starting structure as a III-V compositional semiconductor.

12. A method in accordance with claim 11 wherein one selects $Al_{Ga1-x}As$ as the III-V compositional semiconductor and configures said two-dimensional charge carrier layer as a two-dimensional electron gas.

13. A method in accordance with claim 12 wherein said 2D electron gas is formed in a boundary region between an undoped $Al_{0.3}Ga_{0.7}As$ layer with a thickness smaller than 500 Å, and an undoped thicker layer of GaAs and wherein said electrons originate from a doped layer arranged at a side of said $Al_{0.3}Ga_{0.7}As$ layer remote from the GaAs layer.

14. A method in accordance with claim 13 wherein said undoped $Al_{0.3}Ga_{0.7}As$ layer as formed with a thickness of approximately 200 Å.

15. A method in accordance with claim 13 wherein said doped layer is formed as a layer of $Al_{0.3}Ga_{0.7}As$ with a thickness of approximately 500 Å which is n-doped with Si-atoms at a concentration of approximately $10^{18}$ cm$^{-3}$.

16. Method in accordance with claim 2 wherein said surface of said starting structure is a surface in Miller indices.

17. A method in accordance with claim 1 wherein said starting structure is treated to form an integrated circuit comprising a plurality of interconnected active semiconductor devices having respective source, drain and gate regions together with passive circuit elements likewise defined by the formation of insulating boundaries in said two-dimensional charge carrier layer.

18. A method in accordance with claim 1 wherein said starting structure is treated by a focussed, computer steered, ion beam to cause linewise destruction of the conductivity of the starting structure thereby forming said lateral potential barriers.

19. A method in accordance with claim 1 wherein a mask is provided for said starting structure said mask having linear apertures in it of a shape and a position corresponding to the desired positions of said linear potential boundaries in said starting structure and wherein said starting structure is treated with an extended area ion beam directed at said mask to produce linewise destruction of the conductivity of said starting structure thereby forming said lateral potential barriers.

20. A method in accordance with claim 19 wherein said mask comprises a metallic mask generated on said surface of said starting structure by a photolithographic process and is removed again after treating said starting structure through said mask with said extended area ion beam.

21. A method in accordance with claim 19 wherein said mask is a metallic mask which is laid on said surface of said starting structure prior to treating said starting structure through said mask with said extended ion beam.

22. Method in accordance with claim 18 wherein after said linewise destruction of the conductivity of the starting structure the latter is subjected to a heat treatment which leads to a partial healing of the destruction and to a sharper definition of said insulating boundaries.

23. Method in accordance with claim 19 wherein after said linewise destruction of the conductivity of the starting structure the latter is subjected to a heat treatment which leads to a partial healing of the destruction and to a sharper definition of said insulating boundaries.

24. A method of generating an active semiconductor structure from a starting structure having a surface and a two-dimensional charge carrier layer parallel to said surface, the method comprising the steps of:

a) treating the starting structure to form lateral potential barriers in said 2D-charge carrier layer, said lateral potential barriers acting as line-like insulating boundaries extending through said two-dimensional charge carrier layer, said starting structure being divided up regionally by said insulating boundaries and comprising at least one closed region having a first boundary line and a second boundary line lying opposite to said first boundary line, said second boundary line being spaced from said first boundary line to form a channel region between said first and second boundary lines, said channel region having first and second ends and wherein source and drain regions are provided at said first and second ends of said channel region respectively and wherein said at least one closed region comprises a gate region, and b) forming contacts to said two-dimensional charge carrier layer at said source, drain and gate regions.

25. A method for manufacturing of an integrated or highly integrated circuit wherein one takes a semiconductor starting structure having a surface and at least one 2D-charge carrier layer parallel to the surface and treats said starting structure to form lateral potential barriers in said at least one 2D-charge carrier layer to define active and passive components, said active components having electrode and channel regions defined by respective portions of the 2D-carrier layer delimited by said lateral potential barriers; wherein electrode regions of neighboring components which are connected to one another are in a conductive connection with one another via respective portions of said 2D-charge carrier layer located between them; wherein said electrode regions comprise source regions, drain regions and also gate regions for controlling conduction in said channel regions of said active components; and wherein contacts are provided in selected ones of said electrode regions to the respective portions of said 2D-charge carrier layer.

26. The method in accordance with claim 25 wherein said active components at least one of field effect transistors and logic gates.

27. A method in accordance with claim 25 wherein said passive components comprise resistors formed by elongate channel regions of said 2D-charge carrier layer.

28. A method in accordance with claim 27 wherein said passive components comprise inductors formed by meander-shaped channel regions of said 2D-charge carrier layer.

29. A method in accordance with claim 25, wherein said lateral potential barriers in said at least one 2D-charge carrier layer are formed by bombardment of said starting structure with ions through a mask.

30. A method in accordance with claim 29 wherein said mask is generated on said surface of the said starting structure by a photolithographic process and is removed again after said ion bombardment.

31. A method in accordance with claim 29 wherein said mask is laid on the surface of said starting structure as a mask separate from said starting structure.

32. A method in accordance with claim 29 wherein said lateral potential barriers in the 2D-charge carrier layer are produced by ion implantation to achieve P-doping of a starting structure in which said 2D-charge carrier layer comprises a 2D electron gas.

33. A method in accordance with claim 25, wherein said lateral potential barriers are produced by linewise destruction of the conductivity of the starting structure by means of a sharply focussed ion beam.

34. A method in accordance with claim 25, wherein after the generation of said lateral potential barriers by linewise destruction of the conductivity of said starting structure said starting structure is subjected to heat treatment which leads to a partial healing of said destruction and to a sharper definition of said lateral potential barriers.

35. A method in accordance with claim 25 wherein said channel regions of said active components have a width lying in the order of magnitude of the thickness of the 2D-charge carrier layer.

* * * * *